(12) United States Patent
Li et al.

(10) Patent No.: US 6,756,620 B2
(45) Date of Patent: Jun. 29, 2004

(54) LOW-VOLTAGE AND INTERFACE DAMAGE-FREE POLYMER MEMORY DEVICE

(75) Inventors: Jian Li, Sunnyvale, CA (US); Xiao-Chun Mu, Saratogo, CA (US); Mark Isenberger, Corrales, NM (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 09/897,174

(22) Filed: Jun. 29, 2001

(65) Prior Publication Data

US 2003/0001176 A1 Jan. 2, 2003

(51) Int. Cl.$^7$ .................. H01L 21/44; H01L 21/48; H01L 21/50
(52) U.S. Cl. .................. 257/295; 257/311; 365/145
(58) Field of Search .................. 257/295, 296, 257/311; 365/65, 109, 145

(56) References Cited

U.S. PATENT DOCUMENTS

| | | |
|---|---|---|
| 3,623,038 A | 11/1971 | Franklin et al. |
| 4,538,884 A | 9/1985 | Masaki |
| 4,593,456 A | 6/1986 | Cheung |
| 4,873,455 A | 10/1989 | De Chambost et al. |
| 4,995,705 A * | 2/1991 | Yoshinaga et al. ............ 349/22 |
| 5,248,564 A | 9/1993 | Ramesh |
| 5,438,023 A | 8/1995 | Argos et al. |
| 5,499,206 A | 3/1996 | Muto |
| 5,519,566 A | 5/1996 | Perino et al. |
| 5,578,867 A | 11/1996 | Argos et al. |
| 5,592,643 A | 1/1997 | Thomas |
| 5,777,356 A | 7/1998 | Dhote et al. |
| 5,838,035 A | 11/1998 | Ramesh |
| 5,843,808 A | 12/1998 | Karnezos |
| 5,864,932 A | 2/1999 | Evans et al. |

(List continued on next page.)

FOREIGN PATENT DOCUMENTS

| | | |
|---|---|---|
| EP | 1 152 463 A1 | 11/2001 |
| JP | 363 293 729 A | 11/1988 |
| WO | WO 99/12170 | 3/1999 |
| WO | WO 00/42652 | 7/2000 |
| WO | WO 02/43071 A1 | 5/2002 |

OTHER PUBLICATIONS

Borca, C., et al., "Influence of dynamical scattering in crystalline poly(vinylidene fluoride–trifluoroethylene) copolymers", *Applied Physics Letters, vol. 74*, 347–349, (Jan. 18, 1999).

Borca, C., et al., "Lattice–Stiffening Transition in Copolymer Films of Vinylidene Fluoride (70%) with Trifluoroethylene (30%)", *Physical Review Letters*, 4562–4565, (Nov. 29, 1999).

Bune, A., et al., "Piezoelectric and pyroelectric properties of ferroelectric Langmuir–Blodgett polymer films", *Journal of Applied Physics, vol. 85*, 7869–7873, (Jun. 1, 1999).

(List continued on next page.)

*Primary Examiner*—Minhloan Tran
*Assistant Examiner*—Thomas L Dickey
(74) *Attorney, Agent, or Firm*—Anthony M. Martinez

(57) ABSTRACT

One embodiment of the invention relates to a polymer memory device and a method of making it. The polymer memory device may include a composite or single layer of a ferroelectric polymer memory that addresses surface engineering needs according to various embodiments. The ferroelectric polymer memory structure may include crystalline ferroelectric polymer layers such as single and co-polymer compositions. The structure may include spin-on and/or Langmuir-Blodgett deposited compositions.

One embodiment of the invention relates to a method making embodiments of the polymer memory device. One embodiment of the invention relates to a memory system that allows the polymer memory device to interface with various existing hosts.

18 Claims, 3 Drawing Sheets

U.S. PATENT DOCUMENTS

| | | | |
|---|---|---|---|
| 5,890,016 | A | 3/1999 | Tso |
| 5,927,206 | A | 7/1999 | Bacon et al. |
| 5,939,775 | A | 8/1999 | Bucci et al. |
| 6,034,882 | A | 3/2000 | Johnson et al. |
| 6,054,331 | A | 4/2000 | Woo et al. |
| 6,055,180 | A | 4/2000 | Gudesen et al. |
| 6,072,716 | A | 6/2000 | Jacobson et al. |
| 6,072,718 | A | 6/2000 | Abraham et al. |
| 6,115,281 | A | 9/2000 | Aggarwal et al. |
| 6,141,309 | A * | 10/2000 | Saitou et al. ............ 369/75.1 |
| 6,171,934 | B1 | 1/2001 | Joshi et al. |
| 6,194,229 | B1 | 2/2001 | Basceri |
| 6,210,979 | B1 | 4/2001 | Kweon et al. |
| 6,265,230 | B1 | 7/2001 | Aggarwal et al. |
| 6,269,018 | B1 | 7/2001 | Monsma et al. |
| 6,314,641 | B1 | 11/2001 | Akram |
| 6,323,512 | B1 | 11/2001 | Noh et al. |
| 6,324,069 | B1 | 11/2001 | Weber |
| 6,337,032 | B1 | 1/2002 | Chivukula et al. |
| 6,376,259 | B1 | 4/2002 | Chu et al. |
| 6,420,190 | B1 | 7/2002 | Shimoda et al. |
| 2001/0050869 | A1 | 12/2001 | Nishikawa et al. |
| 2002/0000005 | A1 | 1/2002 | Jermier |
| 2002/0024835 | A1 | 2/2002 | Thomson et al. |
| 2002/0044480 | A1 | 4/2002 | Gudesen et al. |
| 2002/0093845 | A1 | 7/2002 | Matsuoka et al. |

OTHER PUBLICATIONS

Bune, A., et al., "Two–dimensional ferroelectric films", *Nature, vol. 391,* 874–877, (Feb. 26, 1998).

Choi, J., et al., "Phase transition in the surface structure in copolymer films of vinylidene fluoride (70%) with trifluoroethylene (30%)", *Physical Review B, vol. 61,* 5760–5770, (Feb. 15, 2000).

Desu, S., "Minimization of Fatigue in Ferroelectric Films", *Phys. Stat. Sol. (a) 151,* 467–480, (1995).

Ducharme, S., et al., "Ultrathin Ferroelectric Polymer Films", *Ferroelectrics, vol. 202,* 29–37, (1997).

Lovinger, A.J., "Ferroelectric Polymers", *Science, vol. 220,* 1115–1121, (Jun. 10, 1983).

Morikawa, E., et al., "Photoemission study of direct photo-micromachining in poly(vinylidene fluoride)", *Journal of Applied Physics, vol. 87,* 4010–4016, (Apr. 15, 2000).

IBM Technical Disclosure Bulletin, vol. 37 (11), pp. 421–424, 1994.

Bune et al., "Two–Dimensional Ferroelectric Films", Nature, Feb. 26, 1998, MacMillian Magazines, UK, vol. 391, No. 6670 pp. 874–877.

Bune et al., "Novel Switching Phenomena in Ferroelectric Langmuir–Blodgett Films", Applied Physics Letters, Dec. 25, 1995, AIP USA, vol. 67, No. 26, pp. 3975–3977.

* cited by examiner

LOW-VOLTAGE AND INTERFACE DAMAGE-FREE POLYMER MEMORY DEVICE

BACKGROUND OF THE INVENTION

1. Field of the Invention

The present invention relates generally to microelectronic device fabrication. More particularly, the present invention relates to fabrication of a microelectronic storage device. In particular, the present invention relates to a cross-point ferroelectric polymer memory device.

2. Description of Related Art

In the microelectronics field, continual pressure exists to find faster, denser, and more cost-effective solutions to data storage. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity.

It was discovered that some polymers exhibit ferromagnetism. One such polymer is poly vinylidene fluoride (PVDF, whose repeat formula is $(CH_2-CF_2)_n$) and some of its copolymers. Another continual pressure that exists is lower energy requirements for nonvolatile data storage, particularly for mobile platform data storage that may use storage media such as flash memory or disk drives.

What is needed in the art is a non-volatile, low-power data storage solution.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a ferroelectric polymer storage device including a ferroelectric polymer structure that is sandwiched between an array of electrodes that achieve electrical signaling across the ferroelectric polymer structure. With the knowledge of the ferromagnetic qualities of such polymers, the inventors ventured to take advantage of the ability to orient ferromagnetic polymer molecules as a data storage device. A careful design may be accomplished by choosing preferred interfacial layers. This may significantly improve non-volatile memory reliability and storage performance.

The ferroelectric polymer storage device may be referred to as a cross-point matrix polymer memory structure. Because of the mechanical- and thermal-sensitive nature of the ferroelectric polymer composition embodiments, the present invention addresses surface engineering solutions for the polymer memory structures.

The cross-point matrix polymer memory structure may comprise a first electrode. A protective film may be disposed upon the first electrode. A ferroelectric polymer structure is disposed over the protective film and the substrate. A second electrode and a second protective film are disposed in a cross-layout configuration to the first electrode and the first protective film.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
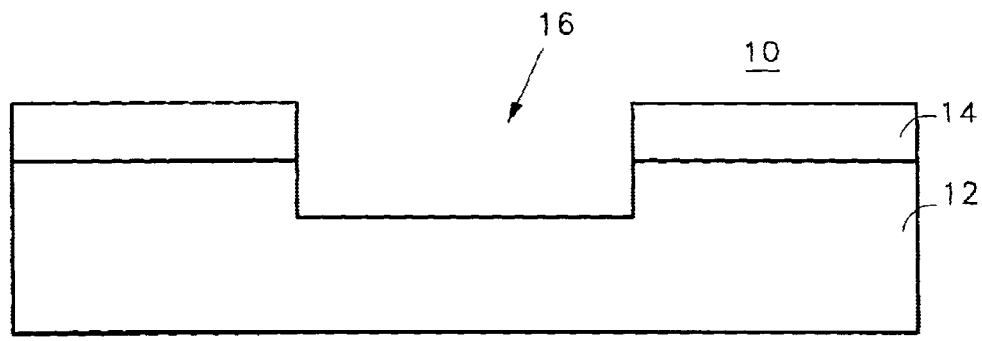
FIG. 1 is an elevational cross-section view of a semiconductor structure that illustrates one stage of fabrication of an embodiment of the present invention.
Figure 2:
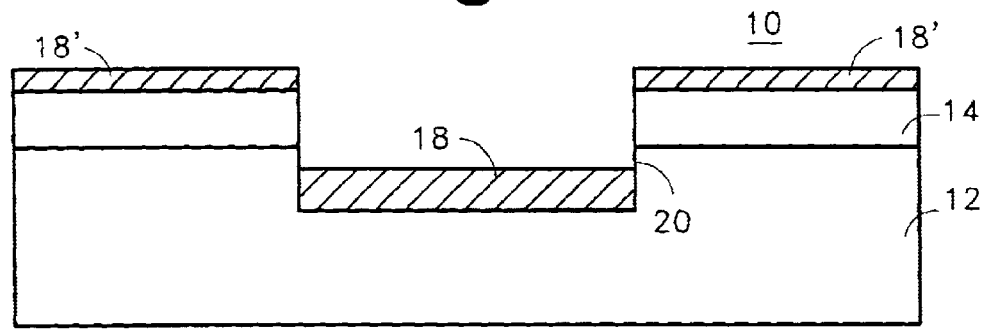
FIG. 2 is an elevational cross-section view of the semiconductor structure depicted in FIG. 1 after further processing.

FIG. 1 is an elevational cross-section illustration of a memory structure 10 during fabrication of a ferroelectric polymer (FEP) memory according to one embodiment. A substrate 12 is depicted as being patterned with a mask 14 and a recess 16 has been formed in substrate 12 through mask 14. Recess 16 is prepared to accept a first or lower electrode 18 as depicted in FIG. 2. First electrode 18 may be formed by chemical vapor deposition (CVD) of any material that is suitable as an electrical conductor according to electrical conductors known in the art. In one embodiment, first electrode 18 is an aluminum material. In one embodiment, first electrode 18 is a copper or copper alloy material. The thickness of the first electrode 18 (and the second electrode 34, depicted in FIG. 5) may depend upon the specific lithography and design rules. FIG. 2 also illustrates extraneous electrode material 18' above and on mask 14, both of which will be removed.

In one embodiment, a self-aligned structure may be formed by initially depositing first electrode 18 by physical vapor deposition (PVD) as depicted in FIG. 2. First electrode 18 may be made of any material that is suitable as an electrical conductor according to what is known in the art. First electrode 18, when formed by PVD, may be carried out in a collimated fashion to achieve little or no contact with the sidewalls 20 above an upper surface of first electrode 18 in recess 16. A collimated PVD will resist contact of electrode material with sidewalls 20 above the upper surface of what is deposited if the aspect ratio of the collimator is set to match or exceed the aspect ratio of recess 16. Mask 14 may remain in place for both patterning of recess 16 and for forming first electrode 18 on substrate 12. After PVD of first electrode 18, mask 14 may be removed according to known techniques such as wet stripping or such as ashing the mask and rinsing the substrate. Accordingly, extraneous electrode material 18' depicted upon mask 14 in FIG. 2, is removed with the mask removal technique.

Figure 3:
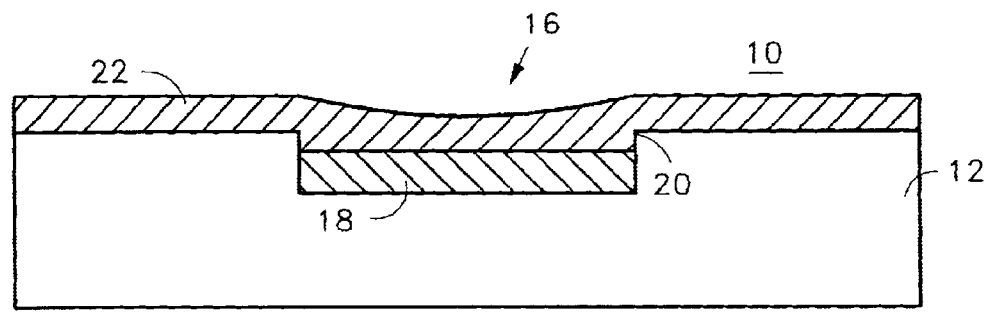
FIG. 3 is an elevational cross-section view of the semiconductor structure depicted in FIG. 2 after further processing.

FIG. 3 illustrates the memory structure 10 after further processing to form a self-aligned electrode structure. A protective layer 22 is formed over substrate 12 and first electrode 18. Protective layer 22 may be formed by CVD or PVD in order to achieve contact at sidewalls 20 of recess 16. CVD and PVD conditions are known in the art, and are often dictated by the specific application, the materials to be deposited, and the thermal budget of the article being manufactured. In one embodiment, atomic layer chemical vapor deposition (ALCVD), according to known technique, is used to from protective layer 22.

Protective layer 22 may be a metal, a refractory metal, or a metal or refractory metal alloy. Additionally, protective layer 22 may be a nitride, oxide, or carbide of the metal, refractory metal, or alloy thereof. Further, combinations of the above may be selected such as a composite protective layer. One embodiment of protective layer 22 includes a titanium nitride layer. Another embodiment includes a titanium oxide layer. Further details of protective layer 22, as to materials embodiments, are set forth herein.

Figure 4:
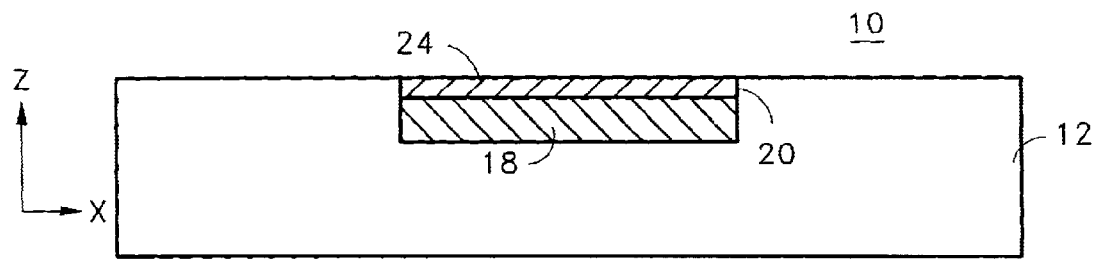
FIG. 4 is an elevational cross-section view of the semiconductor structure depicted in FIG. 3 after further processing.

FIG. 4 illustrates the memory structure 10 after further processing. Protective layer 22 has been reduced in vertical profile to leave a first or lower protective film 24 over first electrode 18. Reduction of the vertical profile may be carried out by mechanical polishing, chemical-mechanical polishing (CMP), chemical etchback, and the like. In one embodiment, CMP is employed with a chemical recipe that is selective to substrate 12, although some reduction of the vertical profile in the Z-direction may be permitted. Accordingly, a damascene structure is formed of substrate 12, first electrode 18, and first protective film 24.

First protective film 24 may be made of a material selected from metals, refractory metals, their alloys, their nitrides, oxides, carbides, and combinations thereof. In one embodiment, first protective film 24 may be a metal such as aluminum. In another embodiment, first protective film 24 may be a refractory metal such as titanium, a refractory metal nitride such as titanium nitride (TiN), or a refractory metal oxide such as titania ($TiO_2$), as either rutile or anatase phase. Other refractory metals may include titanium, zirconium, hafnium, and the like. Other refractory metals may include cobalt and the like. Other refractory metals may include chromium, molybdenum, tungsten, and the like. Other refractory metals may include scandium, yttrium, lanthanum, cerium, and the like.

In one embodiment, first protective film 24 is formed by CVD, PVD, or ALCVD of TiN or $TiO_2$. First protective film 24 may be in a thickness range from about 10 nanometers (nm) to about 100 nm, preferably from about 20 nm to about 50 nm. With the formation of first protective film 24, memory structure 10 is prepared to receive an FEP structure over the substrate 12.

Figure 5:
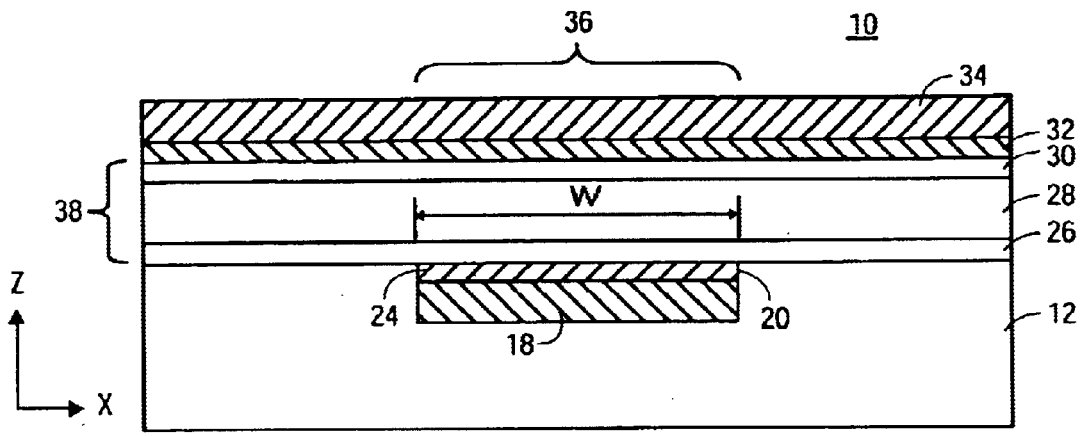
FIG. 5 is an elevational cross-section view of a cross-point polymer memory cell that is the semiconductor structure depicted in FIG. 4 after further processing.

FIG. 5 illustrates the memory structure 10 after further processing. In one embodiment, a first or lower FEP layer 26 is formed over substrate 12 and first protective film 24 by the Langmuir-Blodgett deposition technique. The Langmuir-Blodgett (L-B) deposition technique is well known in the art. It usually comprises an ambient temperature process of dipping a substrate into a vessel containing fluid material that will precipitate onto the substrate during dipping. Thereafter, a spin-on FEP layer 28 is formed above and on first FEP layer 26. Spin-on FEP layer 28 may be formed by depositing the FEP material as a fluid in a puddle prime onto substrate 12 for a period of from about 5 to 25 seconds and spinning substrate 12 and in a rotational range from about 300 revolutions per minute (rpm) to about 6000 rpm and for a time range from about 5 seconds to about 20 seconds.

Following the formation of spin-on FEP layer 28, a second or upper FEP layer 30 is formed above and on spin-on FEP layer 28 by the L-B deposition technique. The formation of first and second FEP layers 26 and 30, respectively, represents surface engineering of spin-on FEP layer 28 that may reduce damage at the interface between the FEP structure 38 and the first and second electrodes 18 and 34, respectively. In other words, where spin-on FEP layer 28 requires isolation from the electrodes in order to prevent damage, surface engineering by forming at least one of the first or second FEP layers 26 and 30, respectively, helps to achieve the preferred isolation. Additionally, the vertical thickness of FEP layers 26 and 30 may be selected to be in the range from about 4.5 Å to about 45 Å. One thickness embodiment is about five monolayers or about 23 Å.

Various polymers may be used to form first and second FEP layers 26 and 30. In one embodiment the FEP layers 26 and 30 are selected from polyvinyl and polyethylene fluorides, copolymers thereof, and combinations thereof. In another embodiment, the FEP layers 26 and 30 are selected from polyvinyl and polyethylene chlorides, copolymers thereof, and combinations thereof. In another embodiment, the FEP layers 26 and 30 are selected from polyacrylonitriles, copolymers thereof, and combinations thereof. In another embodiment, the FEP layers 26 and 30 are selected from polyamides, copolymers thereof, and combinations thereof. Other embodiments may include combinations of the above that cross different types such as polyfluorides and polyamides or polyfluorides and polyacrylonitriles.

In one embodiment, first and second FEP layers, 26, 30 are L-B deposited polymers selected from $(CH_2—CF_2)_n$, $(CHF—CF_2)_n$, $(CF_2—CF_2)_n$, α-, β-, γ-, and δ-phases thereof, preferably the β-phase, $(CH_2—CF_2)_n—(CHF—CF_2)_m$ copolymer, α-, β-, γ-, and δ-phases, preferably the β-phase of $(CH_2—CF_2)_n—(CHF—CF_2)_m$ copolymer, and combinations thereof. The copolymer of $(CH_2—CF_2)_n—(CHF—CF_2)_m$ may be referred to as P(VDF-TrFE) or poly vinylidene fluoride-triflouroethylene. In one particular embodiment, first and second FEP layers, 26, 30 are a copolymer of $(CH_2—CF_2)_n—(CHF—CF_2)_m$ wherein n and m equal 1, and wherein n is in a fraction range from about 0.6 to about 0.9, preferably from about 0.7 to about 0.8, and more preferably about 0.75.

It may be preferable to form crystalline ferroelectric polymers of first- and second-layers 26, 30. By "crystalline" it may be understood that the L-B deposition technique may form a polymer that is a highly ordered structure according to the Miller-Bravais indices lattice system or the like, wherein substantially a monolayer is initially formed. In one example, the formation of a monolayer of P(VDF-TrFE) copolymer may have a vertical profile of about 4.5 Å.

Most polymer systems will exhibit some degree of atacticity, however, the L-B technique has achieved virtually isotactic polymer films. Where a copolymer is formed by the L-B deposition technique, the film will tend more away from isotacticity than for a monomer under similar deposition conditions. In some situations, a syndiotactic film may be formed, even where functional groups in the polymer or copolymer film are bulkier than others. By the same token, a syndiotactic copolymer is achievable under the L-B deposition technique, but the copolymer will also tend toward atacticity, depending upon whether the copolymer film forms as a random, regular, block, or graft copolymer.

The crystalline structure may begin to deviate from a highly ordered (isotactic or syndiotactic) lattice configuration where several monolayers of an FEP structure are formed by the L-B deposition technique. In one embodiment, a five-monolayer structure is formed. In another embodiment, a 10-monolayer structure is formed. Accordingly, instead of a highly ordered monocrystalline lattice structure, lamellae of monolayers or monolayer groups may form with some dislocations at the lamellar interfaces. The crystalline nature of a five- or 10 monolayer structure may be compared to a hypothetical highly ordered five- or 10-monolayer structure, in a range from about 20% crystalline to about 80% crystalline. In one embodiment, the ordered amount of crystallinity (degree of isotacticity or syndiotacticity) in the FEP structure is in a range from about one-third to about two-thirds, preferably greater that about one-half of the lamellar structure up to and including about 95% crystalline. The ordered amount of the crystalline structure may be quantified by diagnostic techniques such as scanning electron microscopy, x-ray diffraction, and others. Under tightly controlled operating conditions, crystallinity may be as high as about 95% for 5- and 10-monolayer structures, and structures between these monolayer numbers.

The spin-on FEP layer 28 that is disposed between layers 26 and 30 may be likewise made of any of the polymers, copolymers, combinations, and ratios thereof as set forth in this disclosure. The thickness of spin-on FEP layer 28 may be in a range from about 500 Å to about 2,000 Å, preferably from about 600 Å to about 1,500 Å, and most preferably from about 700 Å to about 1,000 Å.

FIG. 5 also illustrates further processing in which a second or upper protective film 32 and a second or upper electrode 34 are formed in a configuration that may be referred to as a "cross point" 36 array that exposes FEP structure 38 between first electrode 18 and second electrode 34. In other words, the cross point 36 or projection of the width W, of first electrode 18 upward onto second electrode 34 exposes an area of FEP structure 38 that is about equivalent to the square of width W if second electrode 34 also has a width of about width W. The amount of FEP structure 38 that is within this projected area may be most susceptible of being written to and read from as a memory element embodiment.

The cross point 36 of memory structure 10 may have a dimension in the X-direction that may be tied to a particular minimum-feature mask technology. For example, lithography process flows may have minimum features that are 0.25 micrometers (microns), 0.18 microns, 0.13 microns, and 0.11 microns. Other minimum features that may be accomplished in the future are applicable to the present invention. As set forth herein, the Z-direction thickness of second protective film 32 and second electrode 34, may match those of first protective film 24 and first electrode 18, respectively.

Figure 6:
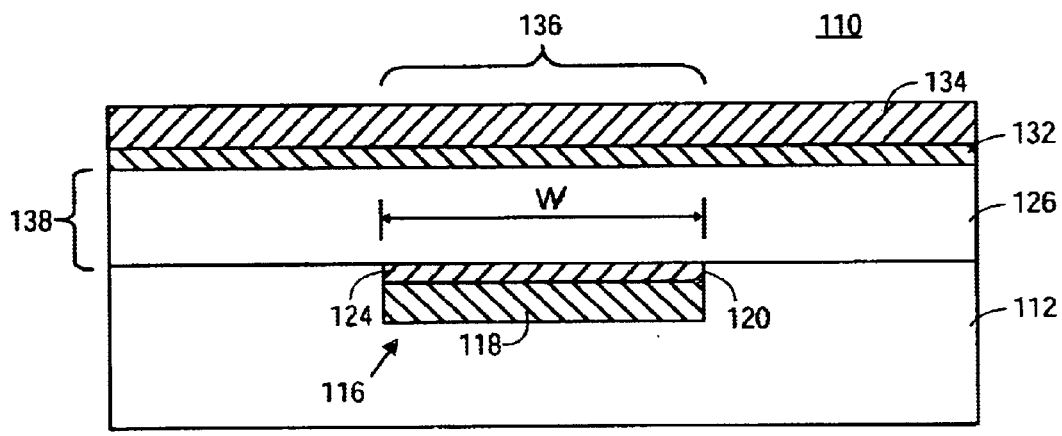
FIG. 6 is an elevational cross-section view of a cross-point polymer memory cell that is the semiconductor structure depicted in FIG. 4 after further processing.

FIG. 6 illustrates another embodiment of the present invention. In one embodiment, a single crystalline FEP layer 126 is formed by the L-B technique as is known in the art.

In FIG. 6, a memory structure 110 includes a substrate 112 and a recess 116 that contains a first or lower electrode 118 disposed within sidewalls 120 of recess 116 as well as a first protective film 124 disposed within the sidewalls 120 of a recess 116. A single, crystalline FEP layer 126 is disposed above and on substrate 112 and first protective film 124. Above and on crystalline FEP layer 126 is disposed a second protective film 132. Accordingly, disposed above and on second protective film 132 is a second or upper electrode 134. The cross point 136, defined by an area that is about the square of width W, is between first electrode 118 and second electrode 134. Cross point 136 comprises a signal interface for data storage according to an embodiment. A crystalline FEP structure 138 is therefore formed out of a single FEP layer 126. The degree of crystallinity may be in a range from about 20% to about 95%, and may within this range, may preferably be more than about half.

Some advantages reside in this embodiment in comparison to a multi-layer structure such as FEP structure 38 depicted in FIG. 5. Although a single about 4.5 Å thick layer, an about 45 Å thick layer, or twice i.e. an about 90 Å thick layer for that matter, may not be significantly thick enough to prevent significant damage at the polymer/electrode interface during ALCVD of second protective film 32, a thicker layer may be made with additional processing time.

Additional processing time may come from a trade-off for a single crystalline ferroelectric polymer layer 126 that may be thinner than ferroelectric polymer structure 38 depicted in FIG. 5. However, the trade-off is that deposition time during a single FEP-layer formation by the L-B deposition technique may expand to include all processing time that previously was needed to form ferro electric polymer structure 38 as depicted in FIG. 5.

Hence the following processing times that otherwise would have been used for surface engineering a multi-layer FEP structure depicted in FIG. 5, may be employed to form crystalline FEP structure 138 depicted in FIG. 6: set-up, deposition, and shut-down time for first FEP layer 26, set-up, spin-on, cure, and shut-down time for FEP layer 28, and set-up, deposition, and shut-down time for second FEP layer 30. Accordingly, the thickness of a single, crystalline FEP layer may be in a range from about 100 Å to about 2,000 Å or larger, subject only to the design rules of a specific application. Other thicknesses may be in a range from about 200 Å to about 1,500 Å. Other thicknesses may be in a range from about 300 Å to about 1,000 Å.

In another embodiment, a spin-on FEP layer may also be a stand-alone FEP structure similar to what is depicted in FIG. 6 as a single, crystalline FEP structure 138. The only deviation from what is depicted in FIG. 6 is that structure 138 is a spin-on layer instead of an L-B deposition layer. It may be noted that the degree of crystallinity of such a spin-on FEP structure 138 may be lower than the degree of crystallinity of crystalline FEP structure 138 formed by L-B deposition. However, it is preferred that the spin-on layer be at least half crystalline.

The thicknesses of a spin-on FEP structure 138 that may be selected may be in a range from about 300 Å to about 2,000 Å or larger. In this spin-on embodiment, surface engineering of the FEP structure may be detailed as the ALCVD formation of the first and second protective films 124 and 132, respectively, as well as the use of PVD for the second electrode 134.

The following discussion may be applicable to the structures depicted in both FIGS. 5 and 6. Protective films 24, and 32, or 124 and 132 are preferably formed by ALCVD according to known technique. Although a CVD of second electrode 34 or 134 is not preferred due to the physical contact- and temperature-sensitive nature of FEP structure 38 or 138, ALCVD of protective films 24, 32 or 124, 132 may be carried out due to the lower processing temperatures required by ALCVD. After the formation of second protective films 32, 132, second electrodes 34, 134 are formed by PVD under conditions that will not substantially damage FEP structures 38, 138, respectively.

Figure 7:
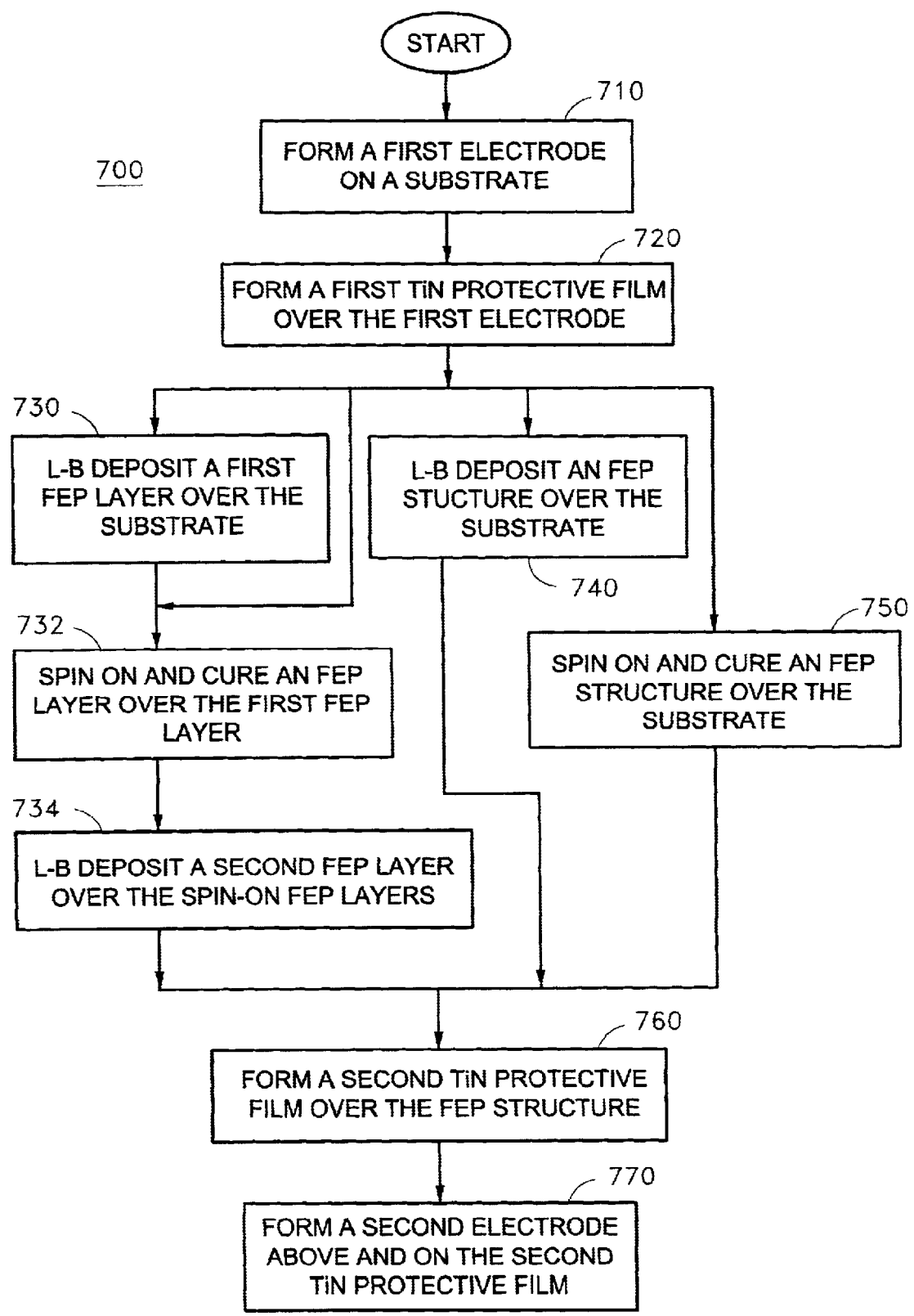
FIG. 7 is a flow chart that describes method embodiments.

FIG. 7 illustrates a process flow embodiment that describes fabrication of a memory cell of an FEP structure and that describes surface engineering of the FEP structure (s). A process 700 includes various process flow alternatives. First the process 700 begins by forming 710 a first electrode on a substrate. The substrate may be silicon with logic and other structures such as embedded memory. The logic and/or embedded memory may include structures such as n-doped metal oxide silicon (n-MOS), p-doped MOS (p-MOS), complementary MOS (CMOS), bipolar CMOS (BiCMOS) and others. The substrate may also be a processor that includes row and column addressing communication at a periphery. As set forth herein, the substrate may also be a fiberglass-resin (FR) type structure.

Upon the substrate, the inventive embodiment(s) may be arranged with contact of first and second electrodes at the periphery. After forming 710 of the first electrode, the process flow continues by forming 720 a first protective film as set forth herein. Thereafter, the process flow may take various embodiments as set forth herein. In one embodiment, an L-B deposition 730 of a first FEP layer is carried out. Next, a spin-on 732 FEP layer is formed above an on the first FEP layer. Thereafter, a second FEP layer is deposited 734 according to the L-B technique.

In another process flow embodiment as set forth herein, a single, crystalline L-B deposition 740 is carried out to form the crystalline FEP layer 126 as depicted in FIG. 6 that amounts to a crystalline FEP structure 138. L-B deposition, although it may be slower than spin-on deposition to achieve a preferred thickness, may form from one to about 1,000 layers or more. In another process flow embodiment as set forth herein, a single spin-on 750 FEP layer is formed that amounts to an FEP structure as set forth herein.

After the formation of an FEP structure, the process flow may continue by forming 760 a second protective film in a pattern that will be aligned with a second electrode. As set forth herein, the second protective film may be formed under ALCVD conditions that will not substantially compromise the integrity of the FEP structure. Thereafter, a second electrode is formed 770 above and on the second protective film.

Interface damage to the FEP structure may be significant only during formation of the second protective film. According to one surface engineering process flow, the L-B deposition 730 process may be omitted. Accordingly, a process flow will proceed from forming 710 a lower electrode, forming 720 a lower protective film, spin-on forming 732 an FEP layer, L-B depositing 734, an upper, crystalline FEP layer, forming 760 an upper protective film, and forming 770 an upper electrode. According to this embodiment, processes may be omitted where not needed.

Figure 8:
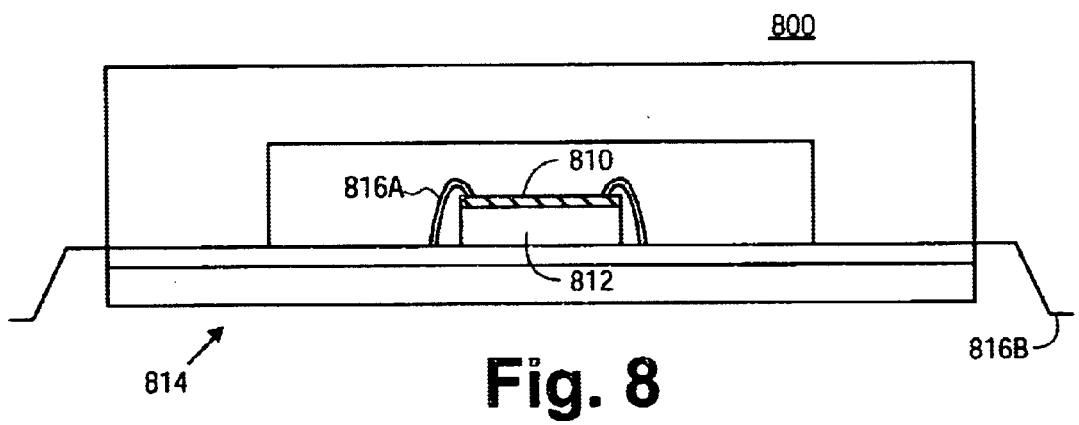
FIG. 8 is an elevational side view of a storage system according to an embodiment of the present invention.

One embodiment of the present invention is a memory system. FIG. 8 illustrates an elevational side view of part of a memory system 800 that is inserted into a host (not pictured) according to an embodiment of the present invention. The memory system 800 besides the host (not pictured) may include a memory article 810 disposed upon a substrate 812 that may be microprocessor silicon or the like. Alternatively, substrate 812 may be a board such as a fiberglass-resin (FR) card or motherboard including a current type referred to as FR4.

In FIG. 8, the substrate 812 is depicted as microprocessor silicon that may contain logic circuitry thereon. A physical interface 814 for a host is also depicted in FIG. 8. In one embodiment, physical interface 814 may be a dual in-line lead frame package that will disposed upon a motherboard, an expansion card, and application-specific integrated circuit (ASIC) board, or the like. A signal interface 816A, 816B is also depicted in FIG. 8. In this embodiment, signal interface 816A may be a bond wire that leads from the memory article 810 to packaging structures of physical interface 814. Signal interface 816B may also comprise a lead frame such as for a dual in-line package. Other embodiments of a signal interface may include optical interfaces including wave guides and spatial transmitter/receiver devices.

The data storage portion of the inventive memory system 800 may include the memory article 810 that is disposed on the substrate 812. As set forth herein, the memory article 810 may comprise a first electrode disposed on a substrate, an FEP structure, and a second electrode as set forth herein. Further, the memory article 810 may include first-and second crystalline FEP films as set forth herein as a surface-engineering solution to resist damage at the electrode-FEP interface. Other, more specific embodiments of the inventive memory system as set forth herein may be employed.

Various physical interfaces may be employed with the inventive memory system 800, depending upon the appropriate host. The memory system 800 may be employed with a physical interface that is configured to a host type selected from communications hosts such as a PCMCIA card interface, a personal data assistant (PDA) interface with or without wireless communication ability, and a hand-held host such as a cellular telephone. Another host type may be a mobile data storage interface that may include a compact flash card interface, a MEMORY STICK® interface made by Sony Corporation, a HIP ZIP® or PEERLESS® interface made by Iomega Corporation, a POCKET CONCERT® interface made by Intel Corporation, and others. Another host type may be a removable storage medium interface, a desktop personal computer expansion slot interface, and the like. In each instance, the appearance of the specific physical interface 814 will vary to take on the requisite receptacle, etc. of the host. Similarly, the appearance of the specific signal interface 816 will vary to take on the requisite connector, etc. of the host.

For example, a PCMCIA card has a physical interface comprising at least the long edges of the card that frictionally and slidingly connect with the card bay. The signal interface for a PCMCIA card comprises at least the female multi-contact sockets at the back of the card, and the specific plug-in outlets at the front of the card.

Low operating voltages are preferred and achieved by embodiments of the present invention. According to an embodiment, switching voltage may be in the range from about 0.5 V to less than about 9 V, and preferably in a range from about 0.5 V to about 5 V. This voltage may relate to both the destructive read method and the write method according to an embodiment. Nonvolatile memory such as flash may require charge pump technology to achieve a sufficient voltage to write to the floating gate. The present invention presents a low-voltage technology for nonvolatile memory that may obviate the need for charge pump technology and other higher-voltage memory technologies.

The following is an example of a method of making an embodiment of the present invention. Reference may be made to FIGS. 1–5. First, a substrate 12 is provided, comprising logic-bearing silicon for an inventive cross-point polymer memory structure including a dielectric material such as silicon oxide. In substrate 12, a recess 16 is etched and a PVD aluminum first electrode 18 is formed within recess 16. A protective layer of TiN is formed by CVD. Again, limited to thermal budget restrictions, PECVD may be substituted for the usually higher-temperature CVD of TiN.

After filling of recess 16 by PECVD of TiN to form a protective layer 22, a CMP process is carried out that reduces the Z-direction profile of the memory structure 10 and converts protective layer 22 to a damascene protective film 24. Under L-B deposition conditions, a first crystalline FEP layer 26 is formed to a thickness from about 5 Å to about 45 Å, preferably about 23 Å from P(VDF-TrFE). Because surface engineering of the ferroelectric polymer structure FEP 38 may only be of significance to the polymer material that is exposed to processing after the formation of structure 38, first crystalline ferroelectric polymer layer 26 may be omitted as set forth herein. Next, a spin-on FEP layer 28 is formed to a thickness from about 500 Å to about 2,000 Å, preferably about 1,000 Å. Spin-on FEP layer 28 may be formed by depositing the FEP material as a fluid in a puddle prime onto substrate 12 for a period of from about 5 to 25 seconds and spinning substrate 12 and in a rotational range from about 300 revolutions per minute (rpm) to about 6000 rpm and for a time range from about 5 seconds to about 20 seconds. Spin-on FEP layer 28 comprises a copolymer of $(CH_2—CF_2)_n—(CHF—CF_2)_m$ wherein n and m equal 1, and wherein n is about 0.75.

A second or upper crystalline FEP layer 26 is L-B deposition formed to a thickness from about 5 Å to about 45 Å, preferably about 23 Å from P(VDF-TrFE). Where either first- and second-crystalline FEP layers 26, 30, respectively are present, the layers in this example comprise a copolymer of $(CH_2—CF_2)_n—(CHF-CF_2)_m$ wherein n and m equal 1, and wherein n is about 0.75.

Thereafter, a mask (not depicted) is patterned in a cross-point configuration to first electrode 18. The mask pattern exposes a width similar to the width of the first electrode. Thereafter, a protective TiN layer is formed with a thickness in the range from about 10 nm to about 100 nm is formed under PVD or ALCVD conditions that operate at or below about 100 ° C. Thereafter, a second electrode is formed by PVD, also at operating conditions at or below about 150° C. in order to protect the FEP structure 38. According to this example, the cross-point matrix polymer memory structure operates in a range below about 9 V, and preferably in a range from about 0.5 V to about 5 V. This voltage may relate to both the destructive read method and the write method according to an embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of making a storage device comprising:
   forming a first electrode over a substrate;
   forming a ferroelectric polymer structure over the substrate;
   forming a first protective film over the ferroelectric polymer structure; and
   forming a second electrode over the first protective film;
   forming a second protective film over the first electrode, wherein forming a second protective film over the first electrode comprises:
      forming a damascene structure in the substrate from the first electrode and the second protective film by a process selected from mechanical polishing, chemical-mechanical polishing chemical etchback, and combinations thereof.

2. A process of making a storage device comprising:
   forming a first electrode over a substrate;
   forming a ferroelectric polymer structure over the substrate;
   forming a protective film over the ferroelectric polymer structure; and
   forming a second electrode over the protective film, wherein forming a ferroelectric polymer structure comprises:
      forming a first ferroelectric polymer layer over the substrate;
      forming a spin-on ferroelectric polymer layer over the first ferroelectric polymer layer; and
      forming a second ferroelectric polymer layer over the spin-on ferroelectric polymer layer.

3. A memory comprising:
   a first electrode disposed over a substrate;
   a ferroelectric polymer structure disposed over the substrate;
   a protective film disposed over the ferroelectric polymer structure; and
   a second electrode disposed over the protective film, wherein the ferroelectric polymer structure comprises:
      a first crystalline ferroelectric polymer layer disposed over the substrate;
      a spin-on ferroelectric polymer layer disposed over the first crystalline ferroelectric polymer layer; and
      a second crystalline ferroelectric polymer layer disposed over the spin-on polymer layer.

4. The memory according to claim 3, wherein the spin-on ferroelectric polymer layer and the crystalline ferroelectric polymer layers are made of the same composition.

5. A cross-point matrix polymer memory structure comprising:
   a first aluminum or copper electrode disposed on a substrate;
   a first refractory metal nitride or oxide protective film disposed above and on the first electrode;
   a ferroelectric polymer structure disposed over the substrate and the first protective film;
   a second refractory metal nitride or oxide protective film disposed over the ferroelectric polymer structure; and
   a second aluminum or copper electrode disposed above and on the second refractory metal nitride protective film.

6. The cross-point matrix polymer memory structure according to claim 5, wherein the ferroelectric polymer structure further comprises:

a first crystalline ferroelectric polymer layer disposed over the substrate, wherein the first crystalline ferroelectric polymer layer has a thickness in a range from about 5 Å to about 45 Å;

a spin-on ferroelectric polymer layer disposed over the first crystalline ferroelectric polymer layer, wherein the spin-on ferroelectric polymer layer has a thickness in a range from about 500 Å to about 2,000 Å;

a second crystalline ferroelectric polymer layer disposed over the spin-on polymer layer, wherein the second crystalline ferroelectric polymer layer has a thickness in a range from about 5 Å to about 45 Å; and wherein crystallinity of the first and second crystalline ferroelectric polymer layers is in a range from about one-third to greater than about one-half.

7. The cross-point matrix polymer memory structure according to claim 5, wherein the ferroelectric polymer structure further comprises:

a crystalline ferroelectric polymer layer disposed above and on the first refractory metal nitride or oxide protective film, and below and on the second refractory metal nitride or oxide protective film, wherein the crystalline ferroelectric polymer layer has a thickness in a range from about 100 Å to about 2,000 Å; and wherein the second refractory metal nitride or oxide protective film is disposed above and on the crystalline ferroelectric polymer layer.

8. The cross-point matrix polymer memory structure according to claim 5, wherein the ferroelectric polymer structure further comprises a polymer selected from $(CH_2—CF_2)_n$, $(CHF—CF_2)_n$, $(CF_2—CF_2)_n$, $\alpha$-, $\beta$-, $\gamma$-, and $\delta$-phases thereof, $(CH_2—CF_2)_n—(CHF—CF_2)_m$ copolymer, $\alpha$-, $\beta$-, $\gamma$-, and $\delta$-phases of $(CH_2—CF_2)_n—(CHF—CF_2)_m$ copolymer, and combinations thereof.

9. The cross-point matrix polymer memory structure according to claim 5, wherein the ferroelectric polymer structure further comprises a copolymer selected from $\alpha$-, $\beta$-, $\gamma$-, and $\delta$-phases of $(CH_2—CF_2)_n—(CHF—CF_2)_m$ copolymer, wherein n and m equal 1, and wherein n is in a fraction range from about 0.6 to about 0.9.

10. The cross-point matrix polymer memory structure according to claim 5, wherein the ferroelectric polymer structure further comprises $\beta$-phase $(CH_2—CF_2)_n$ in $(CH_2—CF_2)_n—(CHF—CF_2)_m$ copolymer, wherein n and m equal 1, and wherein n is in a fraction range from about 0.7 to about 0.8.

11. A memory, comprising:

a damascene structure comprising an electrode; and a ferroelectric polymer structure formed over the damascene structure.

12. The memory of claim 11, wherein the ferroelectric polymer structure comprises:

a first polymer layer coupled to the damascene structure;

a second polymer layer coupled to the first polymer layer; and a third polymer layer coupled to the second polymer layer.

13. The memory of claim 11, wherein the damascene structure further comprises a protective layer, wherein the protective layer is between the electrode and the ferroelectric polymer structure.

14. The memory of claim 13, wherein the protective layer comprises titanium or nitride, the electrode comprises aluminum or copper, and the ferroelectric polymer structure includes a polymer layer selected from polyvinyl and polyethylene fluorides, polyvinyl and polyethylene chlorides, polyacrylonitriles, polyamides, copolymers thereof, or combinations thereof.

15. A method, comprising:

forming a first crystalline ferroelectric polymer layer over a substrate;

forming a spin-on ferroelectric polymer layer over the first crystalline ferroelectric polymer layer; and forming a second crystalline ferroelectric polymer layer over the spin-on polymer layer.

16. The method of claim 15, wherein forming the first crystalline ferroelectric polymer layer comprises Langmuir-Blodgett depositing the first crystalline ferroelectric polymer layer over the substrate and wherein forming a second crystalline ferroelectric polymer layer comprises Langmuir-Blodgett depositing the second crystalline ferroelectric polymer layer over the spin-on polymer layer.

17. The method of claim 15, further comprising: forming a damascene structure coupled to the first crystalline ferroelectric polymer layer, wherein the damascene structure comprises an electrode coupled to the first crystalline ferroelectric polymer layer.

18. The method of claim 15, further comprising: forming a protective layer coupled to the first crystalline ferroelectric polymer layer, wherein the protective layer is formed by atomic layer chemical vapor deposition of materials selected from metals, refractory metals, their alloys, their nitrides, oxides, and carbides, and combinations thereof.

* * * * *